(12) United States Patent
Deak

(10) Patent No.: US 7,868,404 B2
(45) Date of Patent: Jan. 11, 2011

(54) VORTEX SPIN MOMENTUM TRANSFER MAGNETORESISTIVE DEVICE

(75) Inventor: James G. Deak, Eden Prairie, MN (US)

(73) Assignee: NVE Corporation, Eden Prairie, MN (US)

( * ) Notice: Subject to any disclaimer, the term of this patent is extended or adjusted under 35 U.S.C. 154(b) by 339 days.

(21) Appl. No.: 12/229,576

(22) Filed: Aug. 25, 2008

(65) Prior Publication Data

US 2009/0117370 A1    May 7, 2009

Related U.S. Application Data

(60) Provisional application No. 61/001,496, filed on Nov. 1, 2007.

(51) Int. Cl.
*H01L 29/82* (2006.01)

(52) U.S. Cl. ............................. 257/421; 257/E29.323; 365/158; 365/173

(58) Field of Classification Search ........... 257/E29.323
See application file for complete search history.

(56) References Cited

U.S. PATENT DOCUMENTS

| | | | |
|---|---|---|---|
| 6,429,497 B1 | 8/2002 | Nickel | |
| 6,570,783 B1 * | 5/2003 | Deak | 365/158 |
| 6,744,086 B2 | 6/2004 | Daughton et al. | |
| 7,193,286 B2 | 3/2007 | Anderson et al. | |
| 7,230,844 B2 | 6/2007 | Deak | |
| 2004/0076036 A1 * | 4/2004 | Heide | 365/173 |
| 2005/0174701 A1 * | 8/2005 | Kasiraj et al. | 360/324.2 |
| 2006/0018057 A1 * | 1/2006 | Huai | 360/324.2 |
| 2008/0180865 A1 * | 7/2008 | Min et al. | 360/324.11 |
| 2009/0256220 A1 * | 10/2009 | Horng et al. | 257/421 |
| 2010/0232219 A1 * | 9/2010 | Gibson | 365/171 |

OTHER PUBLICATIONS

Slonczewski, J.C., "Current-driven excitation of magnetic multilayers", Journal of Magnetism and Magnetic Materials, 159 (1996) L1-L7.
Bussmann, K. et al., "Current Perpendicular-to-plane GMR for Magnetoelectronic RAM", 1999 IEEE, GA-03.
Zhu, J. et al., "Ultrahigh density vertical magnetoresistive random access memory (invited)", Journal of Applied Physics, vol. 87, No. 9, May 1, 2000, 6668-6673.
Schneider, M. et al., "Magnetic switching of single vortex permalloy elements", Applied Physics Letters, vol. 79, No. 19, Nov. 5, 2001, 3113-3115.
Deak, J.G., "Thermally Activated Vortex Nucleation as a Function of Thickness in Submicron Patterned Permalloy Thin Films", IEEE Transactions on Magnetics, vol. 39, No. 5, Sep. 2003, 2510-2512.
Krivorotov, I.N. et al., "Temperature Dependence of Spin-Transfer-Induced Switching of Nanomagnets", Physical Review Letters, vol. 93, No. 16, Oct. 15, 2004, 166603-1-166603-4.
Deak, J.G., "Spin injection in thermally assisted magnetic random access memory", Journal of Applied Physics, vol. 97, 10E316 (2005) 10E316-1-10E316-3.

(Continued)

*Primary Examiner*—Stephen W Smoot
(74) *Attorney, Agent, or Firm*—Kinney & Lange, P.A.

(57) ABSTRACT

A ferromagnetic thin-film based device that transitioned between alternative magnetic states thereof through having electrical currents established therethrough and has both a reference magnetization and a free layer magnetization provided therein by vortex magnetizations.

20 Claims, 8 Drawing Sheets

OTHER PUBLICATIONS

Sun, J.Z., "Spin Angular momentum transfer in current-perpendicular nanomagnetic junctions", IBM Journal of Research and Development, vol. 50, No. 1, Jan. 2006, 81-100.

Pribiag, V.S. et al., "Magnetic vortex oscillator driven by d.c. spin-polarized current", Nature Physics, vol. 3, Jul. 2007, 498-503.

* cited by examiner

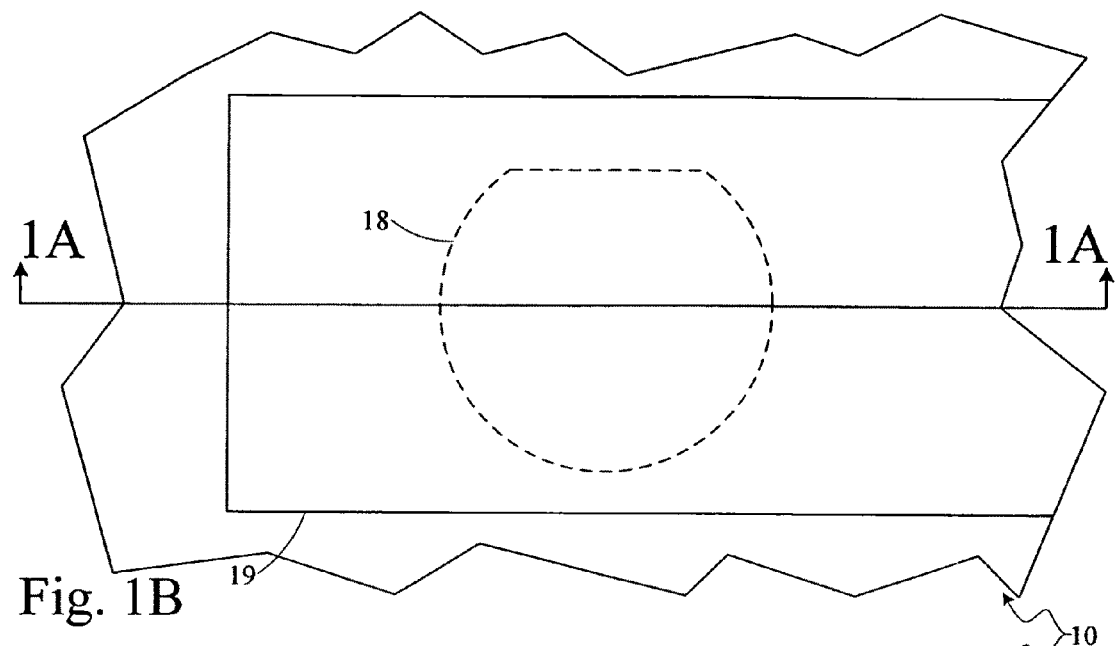
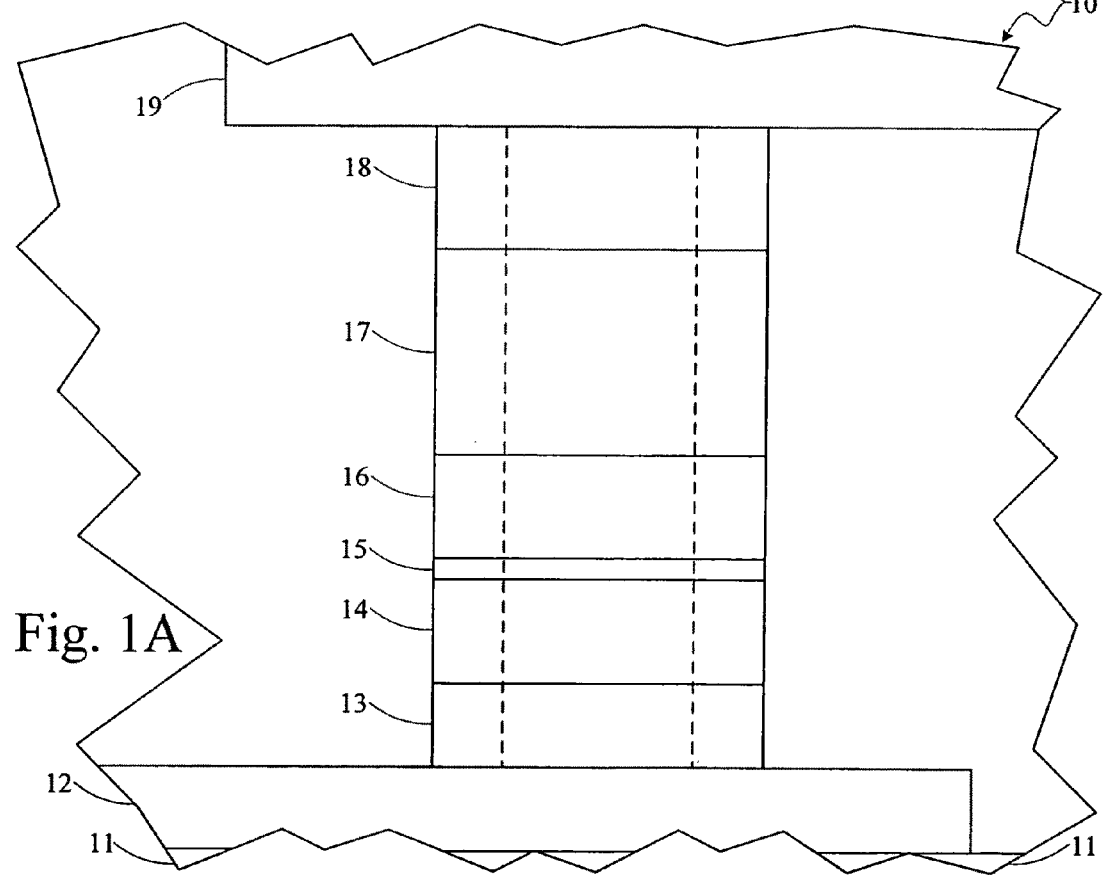

VORTEX SPIN MOMENTUM TRANSFER MAGNETORESISTIVE DEVICE

CROSS-REFERENCE TO RELATED APPLICATION

This application claims the benefit of Provisional Patent Application No. 61/001,496 filed Nov. 1, 2007 for VORTEX SPIN MOMENTUM TRANSFER MAGNETORESISTIVE DEVICE.

STATEMENT OF GOVERNMENT INTEREST

This invention was made with Government support under HQ0006-06-C-7520 awarded by the Missile Defense Agency. The Government has certain rights in the invention.

BACKGROUND

The present invention relates to magnetoresistive devices and, more particularly, to nanopillar magnetoresistive devices.

Nanopillar magnetic devices in which interactions between spin-polarized electrical currents established therein and the magnetic moment of a ferromagnetic material layer therein result in a torque on the magnetization of that ferromagnet through the transfer of angular momentum from that current to that magnetization. These devices formed with a nonmagnetic material provided in the pillar between two ferromagnetic material layers in that pillar have been found to react to electrical currents through these layers by switching the direction of magnetization therein in some circumstances and, in others, by emitting microwaves tunable in frequency by selecting differing values of that current. These effects have been found to occur in such devices where one of the ferromagnetic layers is sufficiently thick to be energetically favorable to nucleate a vortex magnetization state in that layer but there is a desire to be able to select such responses through using the currents established therein to suitably bias the device to yield the desired response.

SUMMARY

The present invention provides a ferromagnetic thin-film based device that is transitioned between alternative magnetic states thereof through having electrical currents established therethrough and which has a reference magnetization provided therein by a vortex magnetization established in a thin-film, this device comprising a substrate and a device structure layer stack. The stack extends in a stack direction from the substrate on which it is supported and has an outer surface curved at least in part about said stack direction with a lateral dimension between opposite curved side portions thereof. The stack comprises a nonmagnetic intermediate layer that has two major surfaces each on an opposite side thereof with a free layer of a ferromagnetic material on one of the major surfaces that has a thickness sufficient to permit a vortex magnetization therein and a reference magnetization layer. This reference magnetization layer has therein a reference ferromagnetic material layer on that remaining one of the major surfaces with its magnetization being a vortex magnetization that is maintained so by a reference antiferromagnetic layer on the reference ferromagnetic material layer.

BRIEF DESCRIPTION OF THE DRAWINGS

FIGS. 1A and 1B show a cross section side view and a top view of a layer diagram of a nanopillar device embodying the present invention.

DETAILED DESCRIPTION

Figure 1C:
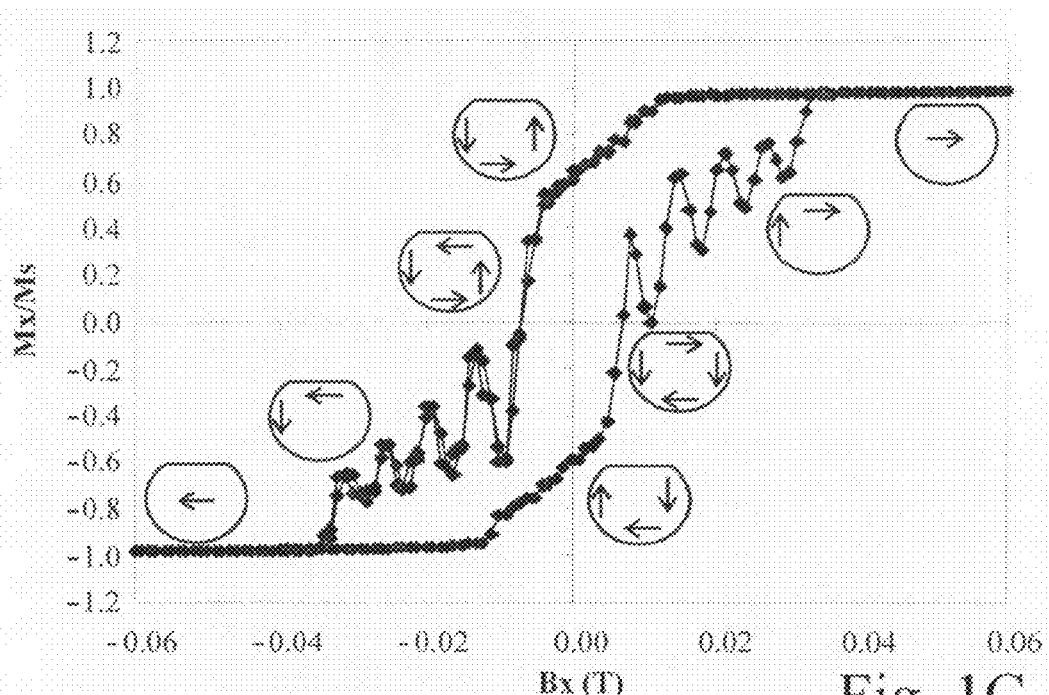
FIGS. 1C, 1D and 1E show a graphical representation for a procedure to predetermine a condition in that device.

A layer diagram representation of a two state magnetoresistive nanopillar device structure, 10, that is generally common to both a "giant magnetoresistive effect" device and a magnetic tunnel junction device, is shown in a "pinned sandwich" structure arrangement in FIGS. 1A and 1B where the section line of FIG. 1B defines the view shown in FIG. 1A. This layer diagram gives an indication of the structural layers, but is not a true cross section view in that many dimensions there are exaggerated or reduced relative to one another for purposes of clarity. FIG. 1B shows the horizontal or top view of nanopillar device 10 to be generally circular but with a flat edge parallel to its length extending along chords of circular cross sections. Nanopillar device 10 typically has a diameter in the circular portion of less than 500 nm and often of less than 200 nm.

A substrate, 11, such as an integrated circuit chip containing much of the device operating circuitry, supports an electrical interconnection structure, 12, typically of copper or aluminum, and an intermediate lead structure, 13, typically of 100 to 500 nm of tantalum, serving together as the bottom contact electrode to a magnetic material (ferromagnetic material) free layer, 14, (meaning its magnetization is relatively free to be rotated to an alternative orientation by a forcing torque). Free layer 14 is thick enough to have a vortex magnetization, or be in a vortex magnetization state, in which the layer magnetization is oriented more or less circularly, or toroidally, around the approximately central axis of the pillar extending along its length. The necessary thickness has a minimum to exceed set by the value thereof needed to pass the boundary between a single domain state and a vortex state at which the exchange energy contribution of the vortex state equals the demagnetization energy of the uniformly saturated state of the layer which, for such a pillar, is typically between 5 nm and 20 nm. A nickel and iron permalloy material can be used for this layer which will provide a positive spin polarization in electrical currents established therethrough.

Free layer 14 is separated by a nonmagnetic material spacer layer, 15, from another magnetic material (ferromagnetic material) relative fixed layer, 16, (meaning its magnetization is much less free to be rotated to an alternative orientation, i.e. is "pinned. If spacer layer 5 is chosen to be an electrical conductor, such as Cu having a thickness typically of around 30 Å, then the device will exhibit the giant magnetoresistive (GMR) effect. If spacer layer 15 is instead chosen to be an electrical insulator, such al $Al_2O_3$ or MgO, having a thickness around 17 Å, then the device will exhibit the spin dependent tunneling effect. In either situation, the electrical resistance of the device is typically higher when the magnetizations of the free and fixed layers on either side of the spacer layer are oriented in opposite directions, and is lower when these magnetizations are oriented in the same direction.

Pinned ferromagnetic material layer 16 is again a nickel and iron permalloy material having a typical thickness of 10 nm or more, and has either a clockwise (CW) or counterclockwise (CCW) oriented vortex magnetization state set therein. This "pinning" of layer 6 is provided by a further magnetic material layer, 17, the "pinning" layer, that is of an antiferromagnetic material such as IrMn having a typical thickness of 10 nm or more which is magnetically coupled to pinned layer 16 and thereby serves to make this two layer pinned structure relatively resistant to rotation of its initial joint magnetization orientation in the presence of moderate external applied magnetic fields. A tantalum cap layer, 18, of typically 80 nm serves as the device top contact electrode providing a conductive path to a further electrical interconnection, 19, typically of aluminum, supported on silicon dioxide provided about the pillar layer stack to electrically isolate same from other such devices.

This setting into pinned layer 16 of a selected one of two oppositely oriented vortex magnetization states allows the choice of alternative device behaviors upon the subsequent establishment of electrical currents therein between electrical interconnections 12 and 19. A dual vortex magnetization states device results with a vortex magnetization state set into pinned layer 16, as indicated, and a resulting vortex magnetization state in free layer 14. The spin-momentum torque resulting on the magnetization of free layer 14 can either be assisted by the torque resulting from electrical currents established between interconnections 12 and 19 or oppose it. Generally, for a spin polarization, $\eta$, that is positive, with the pinned layer 16 vortex magnetization state set CW, the free layer 14 vortex magnetization state shows a well-defined switching behavior that has the orientation of the final vortex state in free layer 14 being dependent on the current direction through nanopillar device 10, and the switching current needed to cause such switching decreases as the magnitude of $\eta$ is increased.

In devices where pinned layer is magnetized CCW, the magnetization dynamics of free layer 14 show a more complicated dependence on $\eta$. Such nanopillar devices 10 show vortex state orientation switching in layer 14 induced by the magnetic fields resulting from relatively large electrical currents at low $\eta$, but chaotic oscillation in the presence of such currents at intermediate values of $\eta$, and well defined switching of vortex states induced by the magnetic fields resulting from relatively small electrical currents at high values of $\eta$. If alternative free layer materials are used that exhibit negative values of $\eta$, rather than positive, the results of pinned layer 16 having its vortex state being oriented either CCW and CW, in this negative value $\eta$ situation, leads again to the free layer 14 dynamics results described above for the positive $\eta$ situation again for both of these orientation conditions. However, the dynamics occurring for one of these orientations for positive values of $\eta$ occurs for the opposite orientation in the negative values of $\eta$ situation.

Setting the orientation of the vortex magnetization state in pinned layer 16 is accomplished through various means. One method would be to supply a large current through the nanopillar device 10 at elevated temperature greater than the blocking temperature ($T_B$) of the pinned layer antiferromagnet 17. If the current is directed from the bottom to the top (electrode 12 to 19), then the pinned layer 16 magnetization would magnetize into a CCW vortex. If the current is directed from layer 19 to layer 12, then the pinned layer 16 magnetization will be set CW. If the temperature is then reduced below $T_B$ and the current through the nanopillar 10 is switched off, the vortex will be locked into the preferred direction.

An alternative means for setting the vortex magnetization state orientation does not require a current to be applied to the nanopillar, and is thus more compatible with mass fabrication, involves choosing nanopillar device 10 having the layers thereof between electrical interconnections 12 and 19 together in the shape of a right cylinder but with one side thereof flattened. The vortex magnetization state orientation can be set relative to the direction of a magnetic field that is applied parallel or anti-parallel to the flat side. The layer tends to magnetize in the shape of the letter C, or a C-state magnetization, (see FIG. 1C at $B_x=\pm0.001$ T—note that the vortex may be set CW or CCW depending on the applied field cycle, but the C-state tends to be stable near zero applied field.) as that field is removed. The ripples in the magnetization are a result of the oscillation of the vortex core as the applied field is being swept at a rate of 25 Oe/ns. A small reverse direction magnetic field needs to be applied after saturation to convert the C-state magnetization into a vortex magnetization state. This is illustrated in FIG. 1C. As seen in FIG. 1C, the C-state can be converted to a vortex by applying a small reverse field.

Figure 1D:
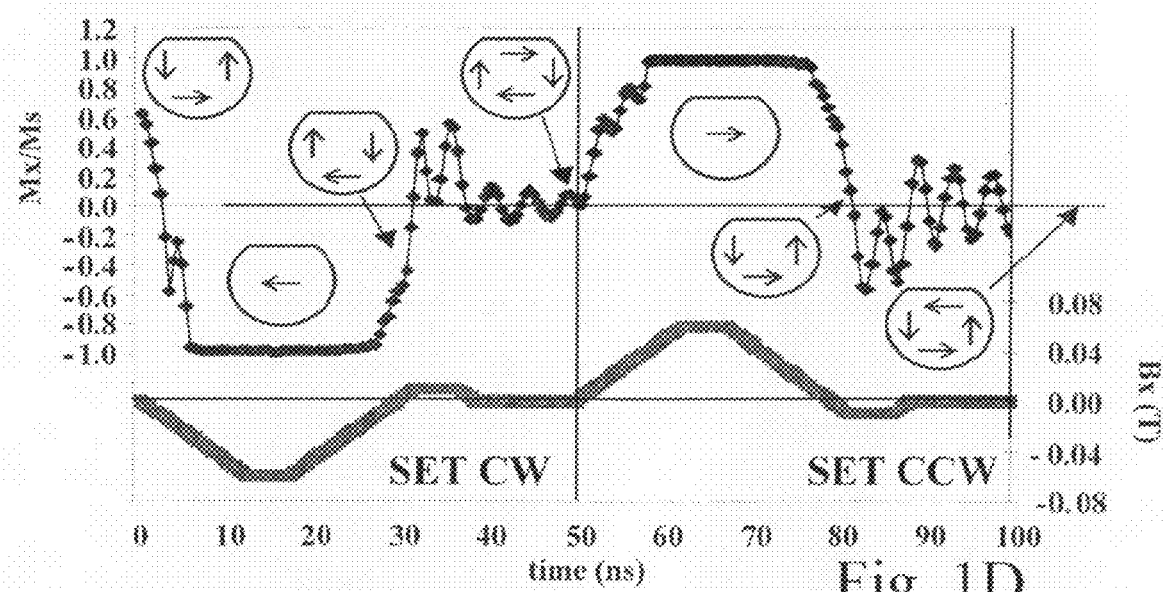

This vortex orientation setting procedure is shown in FIG. 1D. Two sequential sequences are shown. The first sets the magnetization CW, the second sets it CCW. A small reverse field needs to be applied in the direction opposite to the saturating field in order to eliminate the metastable C-state, shown at 30 and 80 ns, that forms after saturation.

Figure 1E:
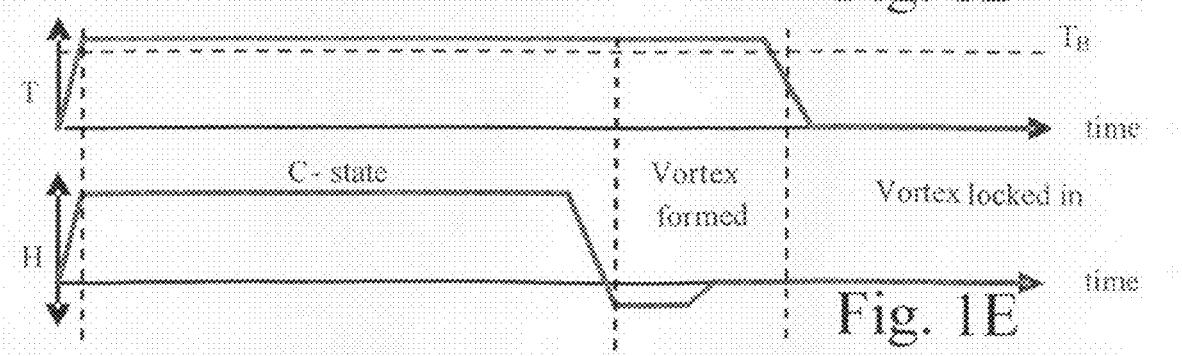

The temperature and field profiles necessary for programming a vortex in a pinned layer composed of an antiferromagnetic/ferromagnetic pinned layer are given in FIG. 1E. There $T_B$ is the blocking temperature of the antiferromagnet. At $T>T_B$, there is no pinning field, and layer 16 is not pinned. At $T<T_B$, the magnetization of layer 16 is locked in.

As indicated above, spin angular momentum transfer or spin momentum transfer (SMT) describes the transfer of spin angular momentum between a spin-polarized current and a ferromagnet. The transfer of angular momentum from the spin-current to the ferromagnet exerts a torque on the magnetization of the ferromagnet. The SMT induced torque can be used to reverse the direction of the magnetization or to induce microwave oscillation of the magnetization of a ferromagnet. SMT can thus be applied to free layer 14 of nanopillar device 10 formed either as a magnetic tunnel junction (MTJ) or vertical giant magnetoresistive (VGMR) structure in order to produce oscillators or magnetic memory devices.

The SMT effect is most often of interest in very small GMR or MTJ nanopillar devices that are patterned with dimensions of less than about 200 nm. In this size range, and as the thickness of the ferromagnetic layers increases above roughly 5 nm, it becomes energetically favorable for the ferromagnetic layers to magnetize into vortex magnetization states. In addition, the current flowing through the nanopillar cylinder also tends to reinforce vortex formation. The direction of the magnetization in pinned layer pinned layer 16, either CW or CCW, is found to determine the type of dynamic behavior the dual vortex nanopillar will exhibit, and is confirmed in the analysis given below.

Figure 2A:
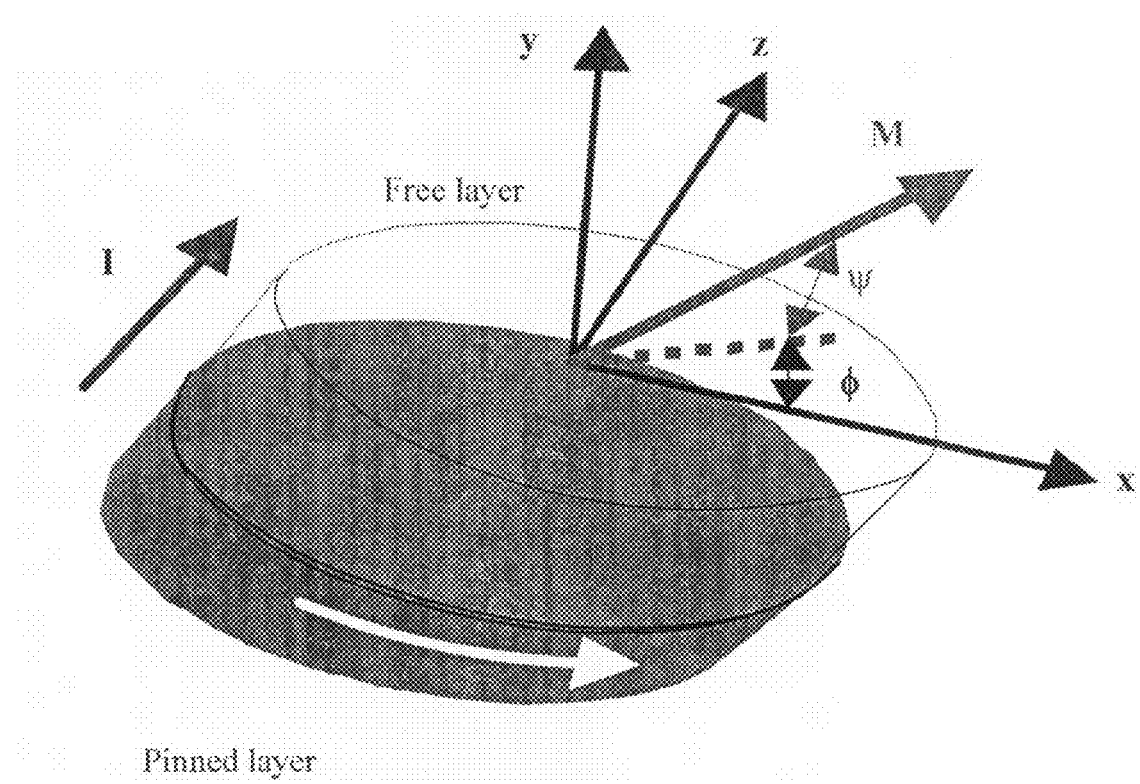
FIGS. 2A and 2B show a schematic perspective view of a representation of the nanopillar device of FIG. 1 indicating parameters used in describing same and displaying a behavioral result.

FIG. 2A schematically shows the geometry used for an SMT nanopillar. The current "I" becomes spin polarized through two effects, one is by transmission through a ferromagnetic layer, and the other is by reflection off a ferromagnetic layer that is magnetized in the direction opposite to an electron's spin. The equation used to describe the dynamical response of a magnetic moment to a magnetic field and spin-polarized current is the Landau-Lifshitz-Gilbert (LLG) equation, with the addition of a term Hs that represents the effective field from spin-polarized current.

$$\frac{(1+\alpha^2)}{\mu_0\gamma}\frac{d\hat{m}}{dt} = -\hat{m}\times\vec{H} - \alpha\hat{m}\times\hat{m}\times(\vec{H}+\vec{H}_s)$$

Figure 2B:
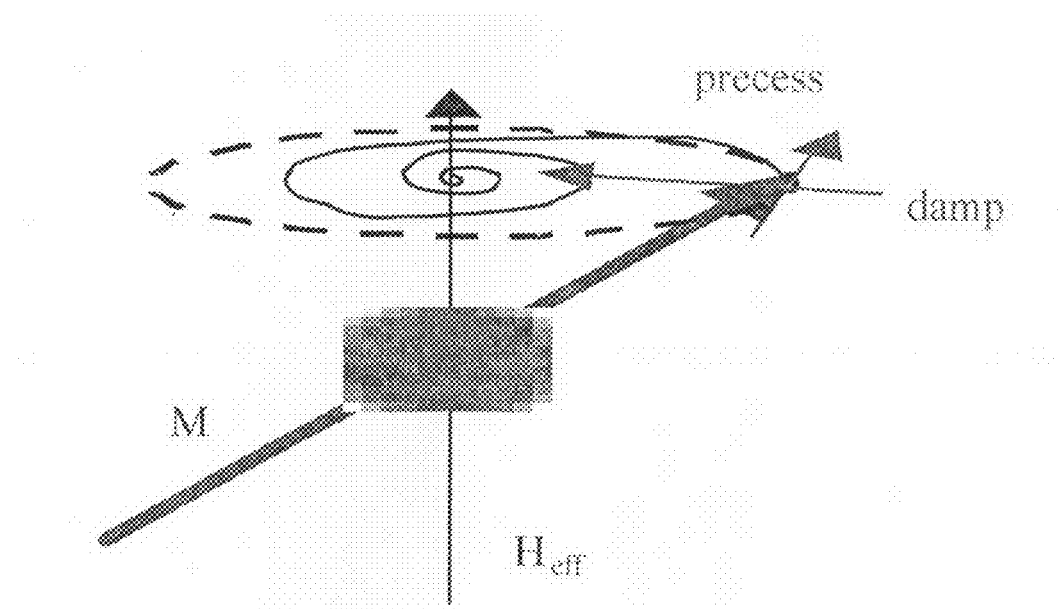

The general behavior of this equation is that after application of a field, H, the magnetization, $\vec{M}=M_s\hat{m}$, will precess around $\vec{H}$ and the precessional cone angle will gradually decrease as $\vec{M}$ aligns with $\vec{H}$ as indicated in FIG. 2B. In the spin-polarized field supplemented Lifshitz-Gilbert equation above, the term on the left represents the rate of change of $\vec{M}$, the first term on the right describes the natural tendency for a magnetic moment to precess around a magnetic field, and the second term on the right describes the damping of the precession as energy is dissipated. Energy dissipation occurs as a transfer of magnetic energy into heat energy. The constant that describes the rate of damping is $\alpha$. The larger the value of $\alpha$, the more quickly the precession damps out.

In this monodomain zero-temperature example, the effective field $\vec{H}$ is given in terms of an externally applied field, and the demagnetizing field of the free layer.

$$\vec{H}=(H_x-N_xM_s\cos(\Psi)\cos(\phi))\hat{x}-N_yM_s\cos(\Psi)\sin(\Psi)\hat{y}-N_zM_s\sin(\Psi)\hat{z}$$

Here the constants $N_x$, $N_y$, and $N_z$ describe the demagnetizing field and can also be used to describe magnetic anisotropy. The effective field is dependent on the orientation of $\vec{M}$, and the unit vector representing the direction of the magnetization of the free layer is given in terms of the angles a follows:

$$\hat{m}=\cos(\psi)\cos(\phi)\hat{x}+\cos(\psi)\sin(\phi)\hat{y}+\sin(\psi)\hat{z}$$

SMT is incorporated into the LLG equation as an effective field from spin-polarized current, which is given as $$\vec{H}_s = \left(\frac{\hbar}{2e}\right)\left(\frac{\eta I}{\alpha M_s V}\right)\hat{x}$$

where, e is the electron charge, $\hbar$ Planck's constant, V the volume of the free layer, and $\eta$ is the degree of spin polarization of the applied current, I.

The magnetization reversal mechanism due to SMT is quite different from that due to a magnetic field alone. In the case of a spin-polarized current, SMT causes a reduction in damping which allows spin waves to grow as long as current is supplied and the orientation of $\vec{M}$ does not cross beyond the hard axis of the ferromagnetic film. To understand how SMT causes magnetization reversal, it's useful to solve the spin-polarized field supplemented Lifshitz-Gilbert equation first given above in the case where the precession angle is small. This permits the equation to be linearized into a second-order differential equation that is analogous to a damped harmonic oscillator.

Thus, $$\frac{(1+\alpha^2)}{\mu_0\gamma}\phi'' + \alpha\{(N_z+N_y-2N_x)M_s + 2(H_x+H_s)\}\phi' + \frac{\mu_0\gamma}{(1+\alpha^2)}\{(N_z-N_x)M_s+H_x\}\{(N_y-N_x)M_s+H_x\}\phi = 0$$

The magnitude and sign of the second term determine the oscillatory behavior of the magnetization. The second term becomes negative if $$|I_c| = \left(\frac{1}{\eta}\right)\left(\frac{2e}{\hbar}\right)\alpha\mu_0 M_s V\left\{\frac{(N_y+N_z)}{2}M_s - N_xM_s + H_x\right\}$$

and the precession angle would thus grow with increasing time, eventually increasing past the equator causing $\vec{M}$ to reverse direction. Once the direction of $\vec{M}$ is reversed, the damping becomes positive and $\vec{M}$ stabilizes in the new orientation. A reversing of the polarity of the current causes $\vec{M}$ to switch into the opposite direction. Note that even the damped oscillator equation above, the equation preceding the last equation above, for a SMT nanopillar with monodomain free and pinned layers is dependent on the polarity of the applied field $H_x$ with respect to $H_S$, which can either increase or decrease the current for the onset of oscillation. The applied field either assists or opposes the SMT effect, thereby increasing or decreasing the critical switching current.

For the dual vortex structure disclosed herein, micromagnetic simulation is needed to account for non-uniform magnetization of the ferromagnetic layers and also for the non-uniform field produced by the current flowing through the nanopillar. Briefly, the LLG equation is solved on a three dimensional mesh by extending the effective field to account for non-uniformity and temperature. Here, $H=H_{eff}=H_{exc}+H_d+H_k+H_{ext}+H_I+H_{ns}$, the total local vector magnetic field within the ferromagnetic object due to exchange, demagnetization, anisotropy, external sources, current, and thermal agitation. The Gaussian distributed $H_{ns}$ field sequence is calculated using the Box-Müller algorithm, with a standard deviation of $H_{ns}=\sqrt{2\alpha k_B T/(\gamma M s V \Delta t)}$ and zero mean. $H_I$ is computed for all current flowing within the mesh using $$\begin{bmatrix} B_x(\vec{R}_{test}) \\ B_y(\vec{R}_{test}) \\ B_z(\vec{R}_{test}) \end{bmatrix} = \begin{bmatrix} 0 & \Delta zF(\Delta x, -\Delta z, \Delta y, L_y) & -\Delta yF(\Delta x, \Delta z, \Delta y, L_z) \\ -\Delta zF(-\Delta z, \Delta y, \Delta x, L_x) & 0 & \Delta xF(\Delta x, \Delta z, \Delta y, L_z) \\ \Delta yF(-\Delta z, \Delta y, \Delta x, L_x) & -\Delta xF(\Delta x, -\Delta z, \Delta y, L_y) & 0 \end{bmatrix} \begin{bmatrix} I_x(\vec{R}_{source}) \\ I_y(\vec{R}_{source}) \\ I_z(\vec{R}_{source}) \end{bmatrix}$$

and

-continued $$F(a, b, c, L) = \frac{10^{-7}}{a^2 + b^2} \left\{ \frac{L/2 - c}{\sqrt{a^2 + b^2(L/2 - c)^2}} + \frac{L/2 + c}{\sqrt{a^2 + b^2(L/2 - c)^2}} \right\}$$

In this notation, "test" indicates the point where the B field from a current filament of length $L=\sqrt{L_x^2+L_y^2+L_z^2}$ at the "source" point is computed. Thus, $\vec{R}_{test}=x_{test}\hat{x}+y_{test}\hat{y}+z_{test}\hat{z}$ and $\vec{R}_{source}=x_{source}\hat{x}+y_{source}\hat{y}+z_{source}\hat{z}$. The deltas are $\Delta x=x_{test}-x_{source}$, $\Delta y=y_{test}-y_{source}$, and $\Delta z=z_{test}-z_{source}$. $H_s$ is also extended to three dimensions.

The simulated stack is a FM/Non-magnetic-spacer/FM/AF nanopillar device of circular cross-section ranging from 100 to 400 nm on a 5 nm cubic mesh in accord with nanopillar device 10 of FIGS. 1A and 1B. The FM/AF (ferromagnet/antiferromagnet) pinned layer is frozen into a vortex, and the pinning field of 500 Oe is oriented at each site in the mesh in order to reinforce the vortex state. The FM layers have, $M_s$=8×10$^5$ A/m, A=1e–11 J/m, and α=0.02. The spin polarization of the FM layers, η, is varied from 0 to –1, and the simulation takes into account both the reflected and transmitted spin currents in both pinned layer 16 and free layer 14. The simulated temperature is 300 K.

Figure 3A:
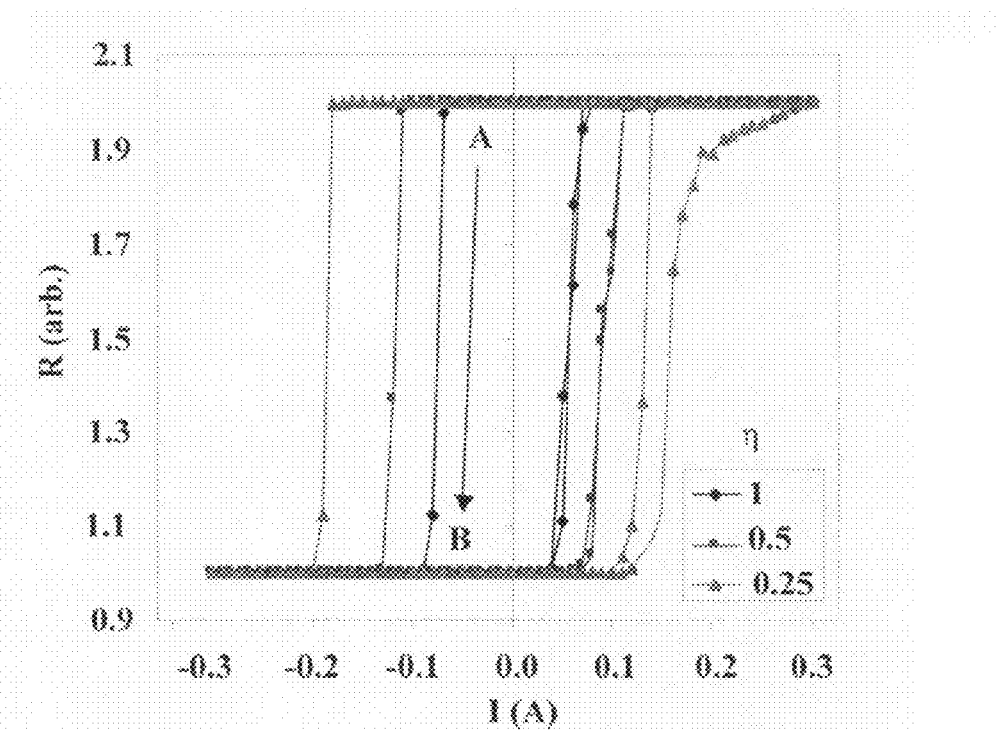
FIGS. 3A and 3B show graphical representations of parameter behaviors in the nanopillar device representation in FIG. 1, FIGS. 4A and 4B show alternative graphical representations of parameter behaviors in the nanopillar device representation in FIG. 1, FIGS. 5A and 5B show graphical representations of other parameter behaviors in the nanopillar device representation in FIG. 1.
Figure 4A:
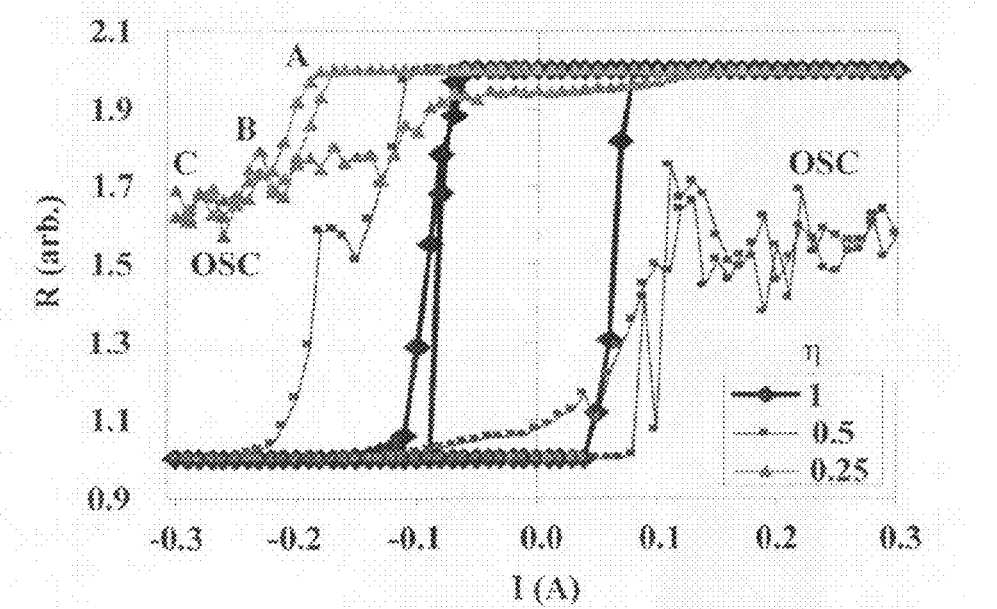
Figure 3B:
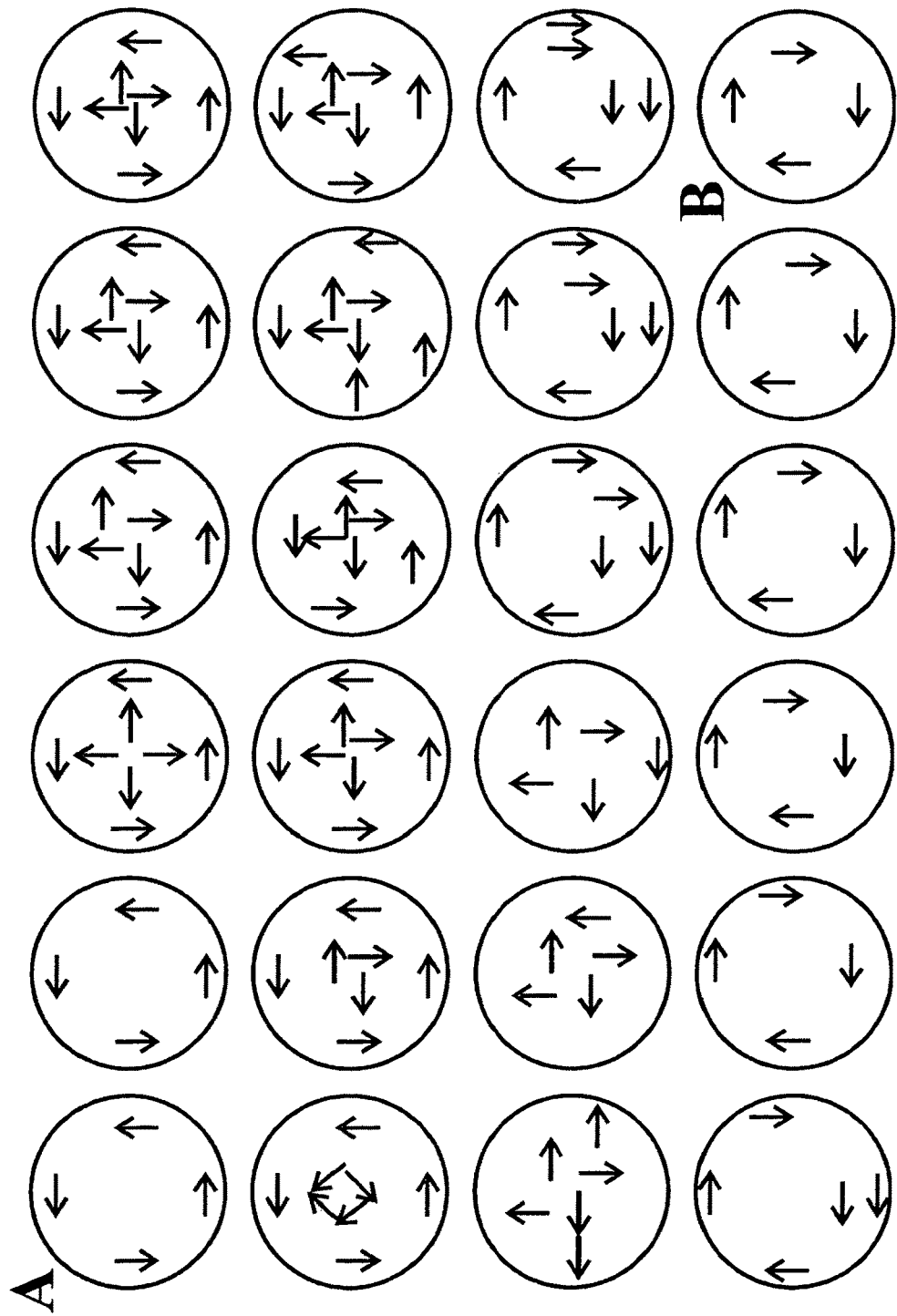
Figure 4B:
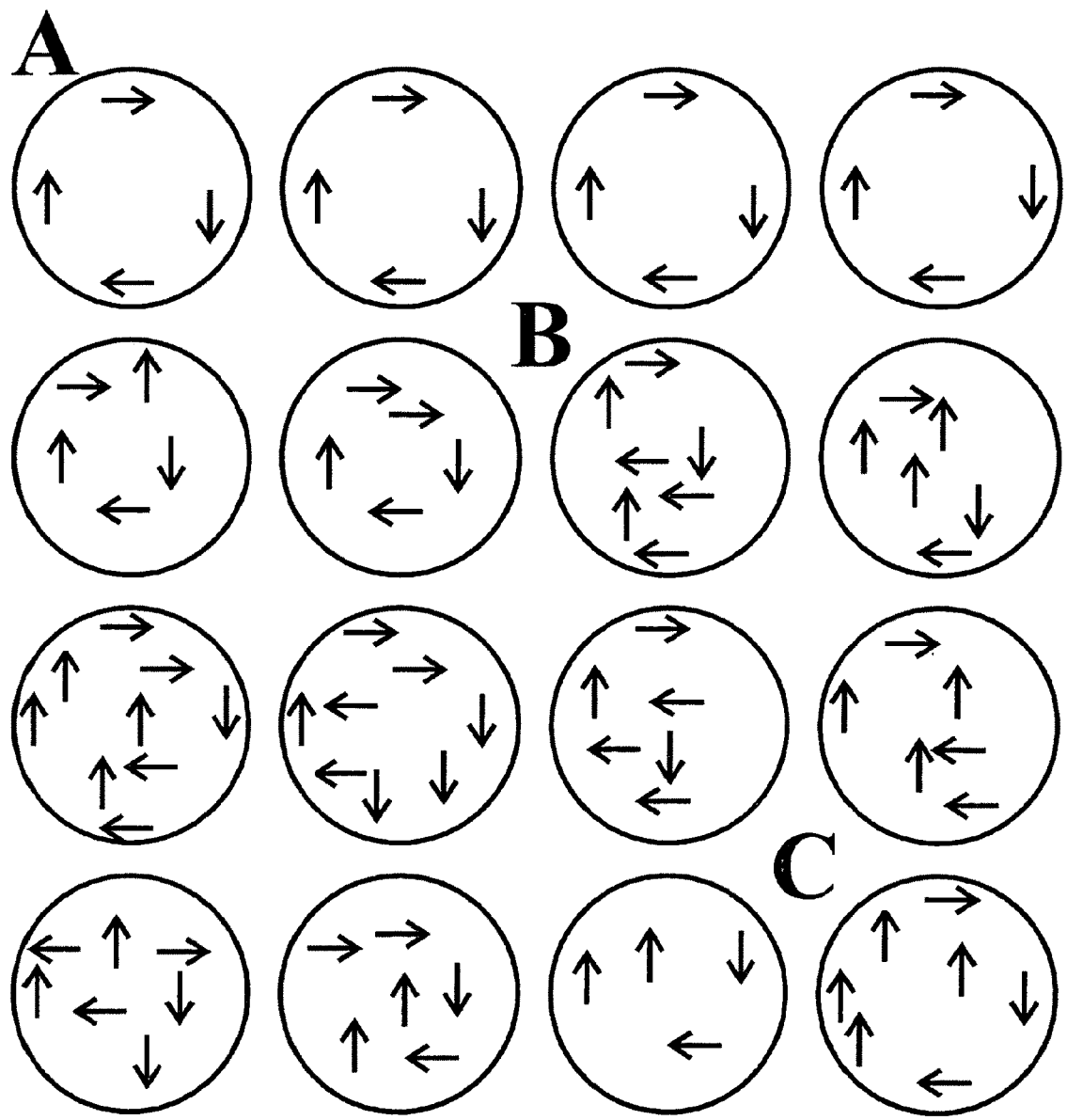

Typical simulation results for a 400 nm diameter dual-vortex nanopillar are shown in FIGS. 3a and 3B, and in FIGS. 4A and 4B, as a function of current through nanopillar device 10, and for pinned layers set in CW and CCW orientations. Similar results are found for 100 and 200 nm diameter nanopillars. The slight offset in the R(I) loops is likely a result of Neel coupling, as the magnetization of the vortex into which the pinned layer 16 is set, is not uniform, and this would be expected to produce a coupling field from that layer. Generally in terms of the switching behavior, we find that in the CCW case switching is not well controlled and oscillation is more likely. Increasing □ improves the switching behavior of the device as it stabilizes at fields lower than the onset of oscillation. In CW devices, because of the polarity of the current induced magnetic field compared to the spin polarization, oscillation doesn't occur for any value of □ at the currents studied. The magnetization patterns that occur during reversal in the CW and CCW pinned layer orientations are quite interesting, and they are shown in FIGS. 3B and 4B along with the R(I) loops in FIGS. 3A and 4A.

FIG. 3 shows results of simulation of dual-vortex nanopillars dynamics as a function of shaving a CW vortex set in the pinned layer, and evolution of the magnetization in the free layer during SMT reversal when the pinned layer is set CW and η=1. The magnetization stabilizes at high current. A snapshot is acquired each 0.06 ns.

FIG. 4 shows results of simulation of dual-vortex nanopillars dynamics as a function of η having a CCW vortex set in the pinned layer, and evolution of the magnetization in the free layer during SMT reversal when the pinned layer is set CCW and η=0.25. The magnetization dynamics become chaotic at high current and the device oscillates at high frequency. A snapshot is acquired each 0.25 ns.

Figure 5A:
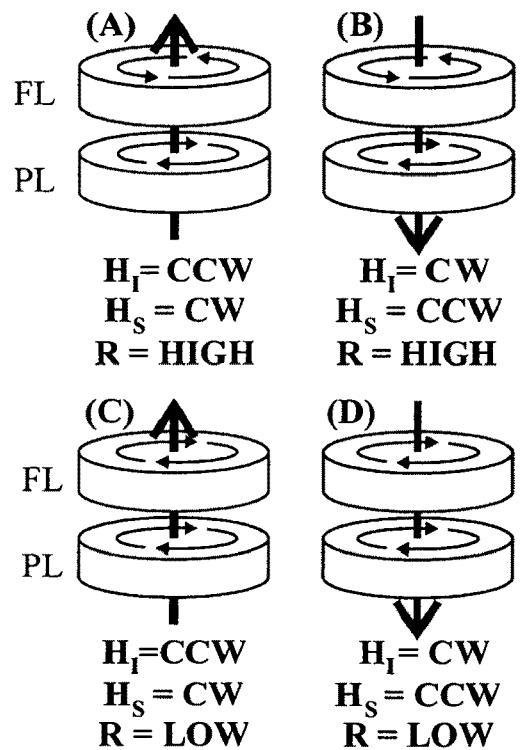
Figure 5B:
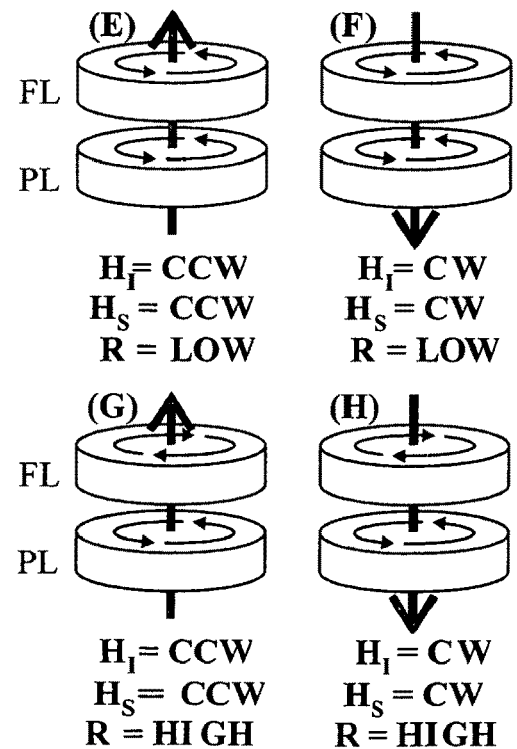

With positive η, it appears that for the CW vortex orientation in pinned layer 16, the H field produced by the spin-polarized current reinforces the SMT effect, and for the CW sense, it opposes SMT reversal. To make this clear, the different configurations and associated effective fields are illustrated in FIG. 5 where the effective field and resistance that result in dual-vortex nanopillar devices as a function of the orientation of free layer 14 and pinned layer 16 magnetizations and currents applied through the device. Spin polarization is positive—transmitted spin current and electrical current are thus in the opposite directions. Note that the CW device produces $S_I$ and $S_H$ effective fields that tend to oppose each other. The figures (A)-(D) have pinned layer 16 CCW and figures (E)-(H) have pinned layer 16 CW. The dependence of the dynamics on the CCW and CW vortex orientations as the polarity of η is reversed in the simulation.

Figure 6:
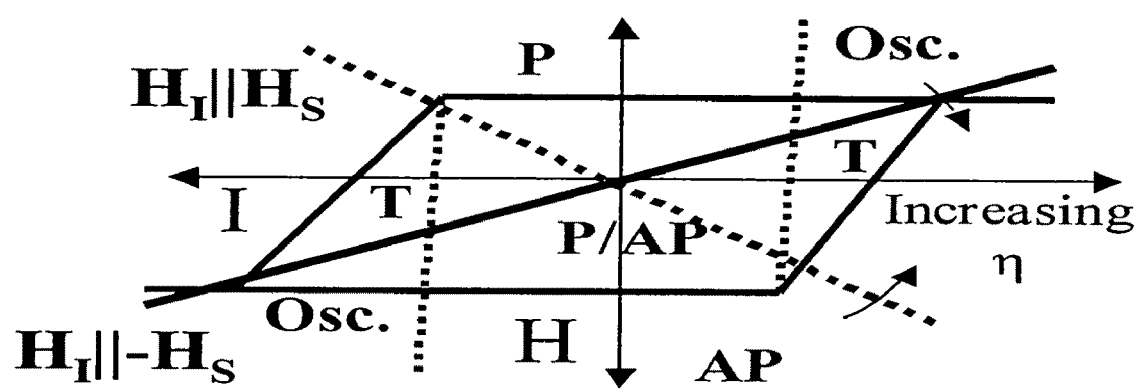
FIG. 6 shows a graphical representation overview of the behavior of the nanopillar device representation in FIG. 1.

A phase diagram that explains the dependence of the dual-vortex nanopillar's dynamics on the orientation of the magnetization of the pinned layer 16 vortex is given in FIG. 6. This is a low temperature phase diagram where "I" refers to the current through the nanopillar, and "H" is the applied field. Here, "P" and "AP" refer to parallel and anti-parallel orientation of the FL and PL, "osc." refers to a regime where the nanopillar oscillates, and "T" refers to the regime where there is random telegraph noise. The lines labeled "$H_I$||$H_S$" and "$H_I$||-$H_S$" describe the contour probed when sweeping the current through a dual-vortex nanopillar device using a CCW or CW oriented vortex in pinned layer 16. The "$H_I$||-$H_S$" or simulated CCW vortex orientation in pinned layer 16 is more prone to oscillation. The contours rotate closer to the "I" axis as η is increased, which generally favors more robust switching at lower current. Because the orientation of the magnetization of the pinned layer 16 vortex changes the polarity of the $H_I$ effective field with respect to the $H_s$ effective field, and the $H_I$ and $H_S$ fields are both proportional to I through the nanopillar, the operating contours must traverse different diagonal quadrants. The CW devices should perform better as memory elements as they do not pass through the oscillatory regions at moderate to large η values, and the CCW devices should perform better as oscillators, since the operating contours pass through the oscillatory regions at moderate to high I for all η values. The improved switching characteristics as η is increased are also evident in the phase diagram. Increasing the magnitude of η is analogous to rotating the operating contours closer to the "I" axis as illustrated in the figure. The figure suggests increased η should favor cleaner switching behavior at lower current as the simulations show.

A dual-vortex scheme for producing either memory or oscillator SMT nanopillar devices without the need for external bias fields hence is described in the foregoing. Dual-vortex nanopillar SMT devices were simulated using a custom micromagnetic code. The simulations were performed as a function of pinned layer vortex magnetization state orientation, spin polarization, and nanopillar dimensions. Generally, for positive η it is found that when the orientation of the magnetization of the pinned layer 16 vortex is set CW, the free layer vortex magnetization orientation shows a well-defined switching behavior. In devices where orientation of the magnetization of the pinned layer 16 vortex is CCW, the free layer magnetization dynamics show a more complicated dependence on η. The CCW magnetized pinned layer nanopillars show magnetic field-induced vortex switching induced by relatively large currents at low η, chaotic oscillation at intermediate η, and well-defined small-current induced field switching at high η. For negative η, the CCW and CW results would be switched with one another.

Although the present invention has been described with reference to preferred embodiments, workers skilled in the art will recognize that changes may be made in form and detail without departing from the spirit and scope of the invention.

The invention claimed is:

1. A ferromagnetic thin-film based device that is transitioned between alternative magnetic states thereof through having electrical currents established therethrough and has a reference magnetization provided therein by a vortex magnetization established in a thin-film, said device comprising:

a substrate, and a device structure layer stack extending in a stack direction from said substrate on which it is supported, said stack having an outer surface curved at least in part about said stack direction with a lateral dimension between opposite curved side portions thereof, the stack comprising:

a nonmagnetic intermediate layer, said intermediate layer having two major surfaces each on an opposite side thereof, a free layer of a ferromagnetic material on one of said major surfaces having a thickness sufficient to permit a vortex magnetization therein, and a reference magnetization layer having therein a reference ferromagnetic material layer on that remaining one of said major surfaces with its magnetization being a vortex magnetization that is maintained so by a reference antiferromagnetic layer on said reference ferromagnetic material layer.

2. The device of claim 1 wherein said lateral dimension that is less than 500 nm.

3. The device of claim 2 wherein said lateral dimension that is less than 200 nm.

4. The device of claim 1 wherein said free layer has a thickness less than 20 nm.

5. The device of claim 1 wherein said free layer has a thickness exceeding 5 nm.

6. The device of claim 5 wherein said free layer has a thickness less than 20 nm.

7. The device of claim 1 wherein said free layer is of an iron and nickel alloy material.

8. The device of claim 7 wherein said free layer has a thickness less than 20 nm.

9. The device of claim 7 wherein said free layer has a thickness exceeding 5 nm.

10. The device of claim 9 wherein said free layer has a thickness less than 20 nm.

11. The device of claim 1 wherein said reference ferromagnetic material layer has a thickness exceeding 10 nm.

12. The device of claim 1 wherein said reference ferromagnetic material layer is of an iron and nickel alloy material.

13. The device of claim 12 wherein said reference ferromagnetic material layer has a thickness exceeding 10 nm.

14. The device of claim 1 wherein said reference antiferromagnetic layer has a thickness exceeding 10 nm.

15. The device of claim 1 wherein said reference antiferromagnetic layer is of an iridium and manganese alloy material.

16. The device of claim 15 wherein said reference antiferromagnetic layer has a thickness exceeding 10 nm.

17. The device of claim 1 wherein said intermediate layer is selected from an electrically conductive material and an electrically insulative material.

18. The device of claim 1 wherein said outer surface of said device structure layer stack is a truncated cylindrical surface.

19. The device of claim 1 wherein said outer surface of said device structure layer stack is a truncated cylindrical surface portion insofar as it extends between two parallel lines also parallel to said stack direction with a remaining portion of said outer surface extending between said two parallel lines being a portion of a plane.

20. The device of claim 1 wherein opposite ends of said device structure layer stack have electrodes thereon for electrically connecting said device to magnetic state setting and determination circuitry.

* * * * *

UNITED STATES PATENT AND TRADEMARK OFFICE
CERTIFICATE OF CORRECTION

| | | |
|---|---|---|
| PATENT NO. | : 7,868,404 B2 | Page 1 of 1 |
| APPLICATION NO. | : 12/229576 | |
| DATED | : January 11, 2011 | |
| INVENTOR(S) | : James G. Deak | |

It is certified that error appears in the above-identified patent and that said Letters Patent is hereby corrected as shown below:

Col. 3, Line 42
  Insert --16-- after pinned layer

Signed and Sealed this
Eighteenth Day of October, 2011

David J. Kappos
*Director of the United States Patent and Trademark Office*